US005084299A

United States Patent [19]

Hirsch et al.

[11] Patent Number: 5,084,299

[45] Date of Patent: * Jan. 28, 1992

[54] METHOD FOR PATTERNING ELECTROLESS PLATED METAL ON A POLYMER SUBSTRATE

[75] Inventors: Tom J. Hirsch, Austin; Charles W. C. Lin, San Antonio; Ian Y. K. Yee, Austin, all of Tex.

[73] Assignee: Microelectronics and Computer Technology Corporation, Austin, Tex.

[ * ] Notice: The portion of the term of this patent subsequent to Jan. 1, 2008 has been disclaimed.

[21] Appl. No.: 600,361

[22] Filed: Oct. 19, 1990

Related U.S. Application Data

[63] Continuation-in-part of Ser. No. 494,897, Mar. 3, 1990, Pat. No. 4,981,715, which is a continuation-in-part of Ser. No. 393,170, Aug. 10, 1989, abandoned.

[51] Int. Cl.$^5$ .......................... B05D 3/06; B05D 5/12; H01L 21/312

[52] U.S. Cl. .................................. 427/53.1; 427/54.1; 427/96; 427/98; 156/628; 156/654; 156/656

[58] Field of Search ....................... 427/54.1, 53.1, 96, 427/98; 156/628, 654, 656

[56] References Cited

U.S. PATENT DOCUMENTS

| | | | |
|---|---|---|---|
| 4,078,096 | 3/1978 | Redmond et al. | 427/98 |
| 4,112,139 | 9/1978 | Shirk et al. | 427/54.1 |
| 4,388,351 | 6/1983 | Sawyer | 427/304 |
| 4,472,513 | 9/1984 | Menger-Hammond et al. | 502/5 |
| 4,486,463 | 12/1984 | Rubner et al. | 427/53.1 |
| 4,517,254 | 5/1985 | Grapentin et al. | 428/626 |
| 4,519,876 | 5/1985 | Lee et al. | 204/15 |
| 4,574,095 | 3/1986 | Baum et al. | 427/53.1 |
| 4,643,798 | 2/1987 | Takada et al. | 156/630 |
| 4,659,587 | 4/1987 | Imura et al. | 427/35 |
| 4,666,735 | 5/1987 | Hoover et al. | 427/43.1 |
| 4,670,306 | 6/1987 | Salem | 427/258 |
| 4,681,774 | 7/1987 | Halliwell et al. | 427/53.1 |
| 4,701,351 | 10/1987 | Jackson | 427/98 |
| 4,822,633 | 4/1989 | Inoue | 427/43.1 |

OTHER PUBLICATIONS

Von Gutfeld et al, "Laser-Enhanced Plating and Etching: Mechanisms and Applications", IBM Journal of Research and Development, vol. 26, No. 2, pp. 136-144 (Mar. 1982).

Cole et al., "Laser-Activated Copper Deposition on Polyimide", Electrochemical Society Meeting, Symposium on Electronic Packaging, pp. A4-7 through A4-12 (Oct. 1987).

Cole et al., "Laser Processing for Interconnect Technology", Optoelectronics and Laser Applications in Science and Engineering, pp. A4-2 through A4-6 (Jan, 1988).

"Deposit Copper Films On Polyimide Using a Laser Catalysed Process", Semiconductor International, p. 16 (Nov., 1988).

Jackson, "Initiation of Electroless Copper Plating Using Pd(+2)/Poly(Acrylic Acid) Films", Journal of the Electrochemical Society, pp. 3172-3173 (Dec., 1988).

A. Auerbach, "Method for Reducing Metal Salts Complexed in a Polymer Host with a Laser", Journal of the Electrochemical Society: Solid-State Science and Technology, vol. 132, No. 6, pp. 1437-1440 (Jun., 1985).

M. E. Gross et al., "Laser Direct-Write Metallization in Thin Palladium Acetate Films", Journal of Applied PHysics, vol. 61(4), pp. 1628-1632 (15 Feb. 1987).

A. Gupta et al, "High-Conductance Customized Copper Interconnections Produced by Laser Seeding and Selective Electrodeposition", Applied Physics Letters, vol. 56(25), pp. 2515-2518 (18 Jun. 1990).

Hirsch et al., "Selective-Area Electroless Copper Plating on Polyimide Employing Laser Patterning on a Catalytic Film", Applied Letters Physics, vol. 57(13), Sep. 24, 1990, pp. 1357-1359.

*Primary Examiner*—Shrive Beck
*Assistant Examiner*—Marianne L. Padgett
*Attorney, Agent, or Firm*—David M. Sigmond

[57] ABSTRACT

A method for patterning electroless plated metal on a polymer substrate. In a first embodiment a substrate is first coated with a polymer suitable for complexing a seed metal which can initiate electroless plating. The polymer is then mixed with a seed metal such as palladium, selectively irradiated to form the desired conductor pattern, and then etched so that the desired pattern remains. The substrate is subsequently placed in an electroless plating bath to form a metal pattern. In a second embodiment, before applying the seed metal a substrate immersed in a polymer solution suitable for complexing a seed metal can be selectively irradiated to selectively deposit polymer on the substrate, followed by applying a seed metal to form a polymer-seed metal mixture and an electroless plating bath. In addition, an alkaline chemical may be added to an acidic polymer to prevent the polymer from etching metal on the substrate.

41 Claims, No Drawings

METHOD FOR PATTERNING ELECTROLESS PLATED METAL ON A POLYMER SUBSTRATE

U.S. GOVERNMENT LICENSE RIGHTS

The U.S. Government has a paid-up license in this invention and the right in limited circumstances to require the patent owner to license others on reasonable terms as provided for by the terms of Contract No. J-FBI-89-103 awarded by the Defense Advanced Research Projects Agency (DARPA).

CROSS-REFERENCE TO RELATED APPLICATIONS

This is a continuation-in-part of U.S. application Ser. No. 07/494,897, filed Mar. 3, 1990, now U.S. Pat. No. 4,981,715; which is a continuation-in-part of U.S. application Ser. No. 07/393,170, filed Aug. 10, 1989, currently abandoned.

BACKGROUND OF THE INVENTION

The present invention relates to the field of selective deposition of thin film metallization on a substrate for microelectronic interconnects. Laser assisted electroless plating has been discussed in the literature in which a laser beam is used to enhance the plating reactions by creating very localized heating. These methods suffer the drawback that the horizontal scan rate of the laser is constrained by the slow vertical electroless deposition rates. These slow vertical deposition rates are inherent in the physics of the process and are not likely to be increased substantially. This time delay may make direct laser writing of plated metal impractical when hundreds or thousands of interconnections must be formed on a substrate.

Another technique for patterning metal on a substrate is by laser assisted chemical vapor deposition of a palladium catalyst, as disclosed in U.S. Pat. No. 4,574,095 to Baum. This method, however, uses a temperature controlled vacuum system during laser writing which requires a much more complex and expensive process than wet chemistry.

It is also well known that a polymer film which does not initially contain palladium can be patterned, and palladium can be subsequently applied to the patterned film to form a catalyst for electroless plating, as described in U.S. Pat. No. 4,666,735 to Hoover and U.S. Pat. No. 4,701,351 to Jackson. In both of these methods, however, conventional photolithography techniques are used to pattern the polymer film; that is, a photoimagible polymer is exposed to light through a mask to create the desired pattern. In the case of the method in Jackson this photoimagible polymer is separate from the polymer which complexes the palladium.

Finally, in a paper by Cole et.al. presented at the Electrochemical Society Meeting in October, 1987 a method is proposed in which palladium compounds are irradiated with a laser to selectively physically alter the palladium in such a way that only the irradiated areas are catalytic to electroless plating. One drawback of this method is that the film must cover the entire substrate prior to laser writing and therefore most of the palladium, an expensive material, may be wasted since in some applications only a small percentage of the substrate area will ultimately contain metal features.

SUMMARY

It is an object of the present invention to provide an improved method of patterning electroless plated metal on a polymer substrate.

Yet a further object of the present invention is a method of forming a pattern of electroless plated metal using an irradiation source to pattern a polymer that is not constrained by the slow vertical electroless deposition rates of the metal to be plated.

A still further object of the present invention is a method of patterning electroless metal to customize or repair existing metallization that does not require the use of photolithography.

Yet another object of the present invention is a method of patterning electroless interconnections or bond pads that encompasses a wide range of metals to be plated.

Yet a still further object of the present invention wherein a pattern can be formed by irradiation of the polymer, with or without the presence of palladium in the polymer, prior to electroless plating.

A still further object of the present invention is wherein an irradiated pattern of polymer can be deposited on the substrate prior to contact with a seed metal, such as palladium, which can initiate electroless plating in order to make economic use of the seed metal.

Yet a still further object of the present invention is to provide a wet chemistry invention that is relatively simple and inexpensive.

In accordance with one aspect of the present invention there is provided a process for the selective deposition of a conductor on a substrate comprising, in sequence, coating the substrate with a layer of a polymer-seed metal mixture, wherein the seed metal is a metal which can initiate electroless plating; drying the polymer-seed metal mixture; selectively irradiating the polymer-seed metal mixture in a predetermined pattern; applying a chemical etch to the polymer-seed metal mixture so that the irradiated portions of the polymer-seed metal mixture etch at a slower rate than the non-irradiated portions of the polymer-seed metal mixture; removing the chemical etch and the etched polymer-seed metal mixture from the substrate wherein the polymer-seed metal mixture remaining on the substrate corresponds to the predetermined pattern; and placing the polymer-seed metal mixture remaining on the substrate in an electroless plating bath so that the desired conductor pattern is formed in the predetermined pattern.

In accordance with another aspect of the present invention there is provided a process for the selective deposition of a conductor on a substrate comprising, in sequence, immersing the substrate in a solution of a polymer which can complex with a seed metal, wherein the seed metal is a metal which can initiate electroless plating; selectively irradiating the immersed substrate in a predetermined pattern so that the polymer is selectively deposited on the substrate where localized heating occurs corresponding to the predetermined pattern; removing the non-deposited polymer solution from the substrate contacting the deposited polymer with a seed metal to form a deposited polymer-seed metal mixture; and placing the deposited polymer-seed metal mixture remaining on the substrate in an electroless plating bath so that the desired conductor pattern is formed in the predetermined pattern.

In another aspect of the present invention there is metal present on the substrate, and an alkaline chemical is added to a polymer solution to increase the PH of the polymer, thereby reducing the ability of the polymer to assist in metal etching.

These and other objects, features and advantages of the present invention will be more readily apparent from a review of the detailed description and preferred embodiments which follow.

DETAILED DESCRIPTION OF THE PREFERRED EMBODIMENTS

For illustration purposes only, unless otherwise indicated, the substrate described herein is a high density copper/polyimide electrical interconnect with copper lines fabricated on and/or embedded in a polyimide dielectric. The copper lines may be fabricated by applying a 0.07 micron adhesion layer of chrome over the polyimide, a 5 micron pattern-electroplated copper layer over the chrome, and a 1 micron layer of nickel over the copper to prevent corrosion. The copper lines can terminate at bonding pads or bumps on the substrate surface to provide electrical interconnection sites for integrated circuit chips. The chips can be surface mounted on the substrate and connected to the bonding pads by tape-automated-bonding (TAB) techniques.

First Embodiment: Two-Step Version

In performing the method of the present invention, preferably the top surface of the substrate will be clean prior to the coating of the polymer layer to ensure good adhesion of the plated metal to the substrate. One such cleaning technique, for example, consists of exposing the substrate surface to an argon plasma in a vacuum chamber for 2.5 kW-minutes.

The substrate is next coated with a polymer which can complex with a seed metal, wherein the seed metal is a metal which can initiate electroless plating. Such polymers include poly(acrylic acid) and polyacrylamid. The polymer layer can be applied by numerous techniques, such as dip coating, spray coating, spin coating or plasma deposition. In any case the polymer solution is dried to form a residual film. Preferably the substrate is coated with poly(acrylic acid), for example by placing a thin layer (approximately 1 millimeter) of 1% by weight aqueous poly(acrylic acid) onto a substrate and allowing the solution to dry in air while the substrate lies flat. After the solution has dried, typically in 15 to 30 minutes, a layer of poly(acrylic acid) approximately 1.5 microns thick remains On the substrate.

The next step is to contact the polymer layer with a liquid solution containing ions of an appropriate seed metal which can initiate electroless plating, so that the polymer will incorporate these seed metal ions and be catalytic for subsequent electroless plating of metal. Suitable seed metals include palladium, platinum, gold, rhodium, and any mixture thereof. The seed metal can be applied by numerous techniques, such as dip coating, spray coating from a solution of the seed metal or by exposure of the substrate to the vapor of the compound. Following this treatment the substrate is preferably rinsed and dried. In the preferred embodiment 0.1 M aqueous palladium sulfate solution is applied to the polymer-coated substrate for 3 minutes, followed by rinsing the substrate with deionized water for 20 seconds, and drying the substrate with pressurized nitrogen.

The use of a substrate coated with a polymer layer and a noble metal compound is well known in the art, see, e.g., U.S. Pat. No. 4,701,351 by Jackson, entitled "Seeding Process for Electroless Metal Deposition" which is hereby incorporated by reference.

The polymer-seed metal mixture is next selectively irradiated so that those regions exposed to localized heating will etch at a slower rate than the non-exposed regions during a subsequent chemical etch. While the preferred energy source is a continuous wave argon laser, numerous other sources of irradiation can be used, such as a frequency doubled Nd:YAG, krypton, or dye lasers, and conceivably particle beams or electron beams as well. In the preferred embodiment an argon laser selectively irradiates those regions where the metal interconnect pattern is desired. For instance, a continuous wave argon laser in the all lines mode can be used with 0.025 W beam power incident on the substrate, focused to form a gaussian-profile spot with 1/(e-squared) radius of 15 microns. A computer controlled X-Y stage can be used to scan the substrate relative to the fixed laser beam at a speed of 100 microns per second, for example, and thus apply a desired pattern of irradiation to the substrate.

After irradiation the substrate is exposed to a suitable chemical etchant in order to etch the irradiated regions at a slower rate than the non-irradiated regions. In the preferred embodiment the substrate is etched until the non-irradiated polymer-seed metal mixture is removed, while little or none of the irradiated portions of the polymer-seed metal mixture are etched. This can be accomplished, for example, by immersing the substrate in 1 M NaOH (sodium hydroxide) for a time appropriate to the thickness of the polymer film, for instance 2 minutes for a 1.5 micron thick film. Another suitable etchant is KOH (potassium hydroxide). The substrate is then rinsed with deionized water for 30 seconds.

In the final step the substrate is exposed to a conventional electroless plating bath in order to deposit the metal in correspondence with the patterned polymer-seed metal mixture. Upon completion of the electroless bath the desired metal interconnects and/or bond pads will adhere tightly to the substrate in the regions where the polymer-seed metal mixture remained. The plating bath can be operated in the conventional manner, for instance, by having the bath heated to an appropriate temperature and agitated by mechanical stirring. While copper is the preferred metal to be plated, other suitable metals can be used, for instance nickel or gold. In the preferred embodiment the electroless bath consists of Shipley "CUPOSIT 385" (trademark) with an immersion time of at least 10 minutes.

First Embodiment: One-Step Version

Alternatively, if desired, instead of coating the substrate with a polymer and then contacting the polymer with a seed metal in separate steps (i.e. a two-step process), a one-step process can be used in which the substrate is coated with polymer-seed metal mixture in a single step. That is, the polymer can be mixed with a seed metal and then a polymer-seed metal mixture can be coated on the substrate in a single step. The one-step process is the same as the two-step process in all other respects and the same results are achieved.

Second Embodiment

In an alternative embodiment of the present invention, the substrate can be immersed in a polymer solution which can complex with a seed metal, and then selectively irradiated before it is contacted with a seed metal which can initiate electroless plating. When irradiating with a focused laser beam, a bubble is generated in the solution at the focal spot. The polymer will then be deposited on the substrate in a thin film only where the localized heating and subsequent bubble occur. The substrate is then removed from the polymer solution and cleaned so that the remaining polymer forms a pattern where it was deposited by the local heating. Thereafter the patterned polymer is contacted with a seed metal so that the pattern becomes catalytic to a subsequent electroless bath. One advantage of this embodiment is that the etching step is eliminated. Another advantage is that the seed metal is absorbed only where the polymer is deposited by irradiation and the electroless bath metal is eventually plated. This economic use of the seed metal is especially important in the case of palladium, which is quite expensive.

In this embodiment, a preferred method is to immerse the substrate in poly(acrylic acid) solution and then selectively irradiate the immersed substrate with a continuous wave argon laser similar to that used in the previous embodiment. Those regions of the substrate where the irradiation causes localized heating will cause a thin film of the polymer from the solution to be selectively deposited. After completion of the irradiation the substrate is removed from the poly(acrylic acid) solution, and the residual polymer solution is removed, for instance, by rinsing with deionized water for 30 seconds. Then the deposited patterned polymer is contacted with 0.1 M palladium sulfate for 3 minutes, and then the substrate is rinsed again in deionized water for 30 seconds. Finally, the polymer-seed metal mixture is exposed to a conventional electroless plating bath to form the desired metallization pattern corresponding to the irradiated pattern. The second embodiment is the same as the first embodiment in all other respects and the same results are achieved.

Peeling Gold/Nickel Metallurgy

Applicant's initial experiments were with copper/-polyimide substrates as previously described. In later experiments, Applicant applied the present invention to polyimide substrates in which the metal lines on the substrate were a metal sandwich consisting of a 0.07 micron layer of chrome deposited on the polyimide, a 0.25 micron layer of copper deposited on the chrome, a 3 micron layer of nickel deposited on the copper, and a 2 micron layer of gold deposited on the nickel (hereinafter "gold/nickel metallurgy"). Gold/nickel metallurgy may be advantageous for the top layer of a copper/-polyimide substrate since gold tends to be a preferred bonding pad for may chip bonding techniques. Furthermore, if the substrate is customizable then the gold-/nickel metallurgy may be particularly well suited for laser customization processes.

In Applicant's initial experiments the gold/nickel metallurgy adhered well to the substrate when a poly(acrylic acid) polymer film was applied to the substrate. However, after the poly(acrylic acid) was removed from the substrate the gold and nickel peeled off the substrate. Applicant ascertained that the cause of the peeling was not the sodium hydroxide etchant used to strip the poly(acrylic acid). Additionally, the peeling occurred whether or not the poly(acrylic acid) contained palladium. Microscopic examination indicated the remaining metal on the substrate was chrome.

Applicant suggests one possible explanation for the peeling: The poly(acrylic acid) assists in etching the thin copper layer between the chrome and the nickel, whereas the chrome, nickel and gold are not appreciably etched. Furthermore, the galvanic effect may also play an important role in the peeling.

As a solution to the peeling problem, Applicant added an alkaline chemical to the poly(acrylic acid) in order to increase the PH of the poly(acrylic acid) and thereby reduce, or possibly eliminate, any significant etching of the copper. Greatly reduced peeling was observed. In principle, a variety of alkaline chemicals would work, such as sodium hydroxide and potassium hydroxide. However, a preferred alkaline chemical contains an ion or molecule which is larger, most preferably much larger, than the ions of the seeding metal. For instance, if a palladium seed metal is used, applying an alkaline chemical such as sodium hydroxide or potassium hydroxide that have ions not larger than palladium ions could result in the alkaline chemical replacing the palladium in the poly(acrylic acid). This could inhibit or prevent the polymer from acting as a catalyst for electroless plating. For palladium seeding metal a preferred alkaline chemical is ammonium hydroxide. In one experiment the initial PH of poly(acrylic acid) was 2.6, indicative of a moderately strong acid. Applicant added ammonium hydroxide until the PH of the poly(acrylic acid) was raised to 4, which is significantly less acidic then the original 2.6 PH. After completing the remaining steps of the present invention the substrates revealed either no peeling at all, or just a few peeled features. Thus it may be preferable to raise the PH of the poly(acrylic acid) above 4.

EXAMPLES

The present invention will be illustrated further by the following examples. These examples are meant to illustrate and not to limit the invention, the scope of which is defined solely by the appended claims.

EXAMPLE 1

A multi-chip packaging substrate, consisting of a silicon wafer coated with several layers of polyimide (total thickness approximately 30 microns) and copper features prepatterned by conventional methods, was cleaned in an oxygen plasma for 2.5 kW-minutes. The substrate was then covered with a 1 millimeter thick liquid film of 1% aqueous poly(acrylic acid) (molecular weight 250,000) and subsequently allowed to dry in a horizontal position in air for 1 hour. A solid layer of poly(acrylic acid) approximately 1.5 microns thick formed on the substrate. the substrate was covered with 0.1 M palladium sulfate for 3 minutes, then rinsed with deionized water for 20 seconds and then dried with pressurized nitrogen at room temperature for 10 seconds. The substrate was then irradiated in various patterns at a horizontal scan rate of 100 microns per second with a focused continuous-wave argon laser in all-lines mode with an incident beam power of 0.025 W and a 1/(e squared) beam radius of approximately 15 microns. The irradiated areas had complexed poly(acrylic acid) over both the polyimide and the copper features on the polyimide. The patterns were mostly configured to connect the previously isolated copper features. The substrate was next etched in 1 M aqueous NaOH at room temperature for 2 minutes and then rinsed with deionized water for 30 seconds. Finally the substrate was exposed to a Shipley "CUPOSIT 385" (trademark) copper electroless plating bath for 10 minutes, operated at 30 degrees C. with mechanical stirring. A copper pattern corresponding to the irradiated regions adhered tightly to the substrate.

EXAMPLE 2

A multi-chip packaging substrate similar to that in example 1 was cleaned in an argon plasma for 2.5 kW-minutes. The substrate was then immersed in 2% poly(acrylic acid) (molecular weight 250,000) in glycerol. Next the immersed substrate was irradiated in a crossed-line pattern at a horizontal scan rate of 100 microns per second with a focused continuous-wave argon laser in all-lines mode with an incident beam power of 0.025 W and a 1/(e squared) beam radius of approximately 15 microns. The substrate containing patterned polymer was then removed from the poly(acrylic acid) and rinsed with deionized water for 30 seconds, and then covered with 0.1 M palladium sulfate for 3 minutes, and then rinsed again with deionized water for 20 seconds. Finally the substrate was exposed to a Shipley "NIPOSIT 468" (trademark) nickel electroless plating bath operated at 66 degrees C. with mechanical stirring for minutes. The desired nickel pattern adhered tightly to the substrate.

The present invention is therefore well adapted to carry out the objects and attain the ends and advantages mentioned, as well as others inherent therein. While presently preferred embodiments of the invention have been described for the purpose of disclosure, numerous changes in the details of construction and arrangement of parts may be made without departing from the spirit of the present invention and the scope of the appended claims.

What is claimed is:

1. A process for the selective deposition of a conductor on a substrate comprising the following steps in the sequence set forth:

(a) coating the substrate with a layer of a polymer-seed metal mixture, wherein the polymer is complexed with the seed metal by mixing the polymer and seed metal ions in solution and the seed metal is a metal which can initiate electroless plating, () drying the polymer-seed metal mixture, (c) selectively irradiating the polymer-seed metal mixture in a predetermined pattern, (d) applying a chemical etch to the polymer-seed metal mixture so that the irradiated portions of the polymer-seed metal mixture etch at a slower rate than the non-irradiated portions of the polymer-seed metal mixture, (e) removing the chemical etch and the etched polymer-seed metal mixture from the substrate wherein the polymer-seed metal mixture remaining on the substrate corresponds to the predetermined pattern, and (f) placing the polymer-seed metal mixture remaining on the substrate in an electroless plating bath so that the desired conductor pattern is formed in the predetermined pattern.

2. The process in claim 2 wherein prior to step (a) the substrate surface is cleaned.

3. The process in claim 1 wherein the polymer is selected from the group consisting of poly(acrylic acid) and polyacrylamid.

4. The process in claim 1 wherein the seed metal is selected from the group consisting of palladium, platinum, gold, rhodium, and any mixture thereof.

5. The process in claim 1 wherein the source of irradiation is a laser beam.

6. The process in claim 1 wherein the etchant is selected from the group consisting of KOH and NaOH.

7. The process in claim 1 wherein the electroless plating bath is used to plate a metal selected from the group consisting of copper, nickel, and gold.

8. A process for the selective deposition of a conductor on a substrate comprising the following steps in the sequence set forth:

(a) coating the substrate with a mixture of a polymer and a seed metal, wherein the polymer is complexed with the seed metal by mixing the polymer and seed metal ions in solution and the seed metal is a metal which can initiate electroless plating selected from the group consisting of palladium, platinum, gold, rhodium, and any mixture thereof to form a layer of polymer-seed metal mixture.

(b) drying the polymer-seed metal mixture, (c) selectively irradiating the polymer-seed metal mixture in a predetermined pattern, (d) applying a chemical etch to a polymer-seed metal mixture so that the irradiated portions of the polymer-seed metal mixture etch at a slower rate than the non-irradiated portions of the polymer-seed metal mixture, (e) removing the chemical etch and the etched polymer-seed metal mixture from the substrate wherein the polymer-seed metal mixture remaining on the substrate corresponds to the predetermined pattern, and (f) placing the polymer-seed metal mixture remaining on the substrate in an electroless plating bath from the group consisting of copper, nickel and gold so that the desired conductor pattern is formed in the predetermined pattern.

9. The process in claim 8 wherein prior to step (a) the substrate surface is cleaned.

10. The process in claim 8 wherein the polymer is selected from the group consisting of poly(acrylic acid) and polyarcylamid.

11. The process in claim 8 wherein the source of irradiation is a laser beam.

12. The process in claim 8 wherein the etchant is selected from the group consisting of KOH and NaOH.

13. A process for the selective deposition of a conductor on a substrate comprising the following steps in the sequence set forth:

(a) coating the substrate with a layer of a polymer which can complex with a seed metal, wherein the seed metal is a metal which can initiate electroless plating, (b) contacting the layer of polymer with a solution containing seed metal ions to form a polymer-seed metal mixture wherein the polymer is complexed with the seed metal, (c) drying the polymer-seed metal mixture, (d) selectively irradiating the polymer-seed metal mixture in a predetermined pattern, (e) applying a chemical etch to the polymer-seed metal mixture so that the irradiated portions of the polymer-seed metal mixture etch at a slower rate than the non-irradiated portions of the polymer-seed metal mixture, (f) removing the chemical etch and the etched polymer-seed metal mixture from the substrate wherein the polymer-seed metal mixture remaining on the substrate corresponds to the predetermined pattern, and (g) placing the polymer-seed metal mixture remaining on the substrate in an electroless plating both so that the desired conductor pattern is formed in the predetermined pattern.

14. The process in claim 13 wherein prior to step (a) the substrate surface is cleaned.

15. The process in claim 13 wherein the polymer is selected from the group consisting of poly(acrylic acid) and polyarcylamid.

16. The process in claim 13 wherein the seed metal is selected from the group consisting of palladium, platinum, gold, rhodium, and any mixture thereof.

17. The process in claim 13 wherein the source of irradiation is a laser beam.

18. The process in claim 13 wherein the etchant is selected from the group consisting of KOH and NaOH.

19. The process in claim 13 wherein the electroless plating bath is used to plate a metal selected from the group consisting of copper, nickel, and gold.

20. A process for the selective deposition of a conductor on a substrate comprising the following steps in the sequence set forth:

(a) coating the substrate with a layer of a polymer which can complex with a seed metal, wherein the seed metal is a metal which can initiate electroless plating, (b) contacting the layer of polymer with a solution containing seed metal ions selected from the group consisting of palladium, platinum, gold, rhodium, and any mixture thereof to form a polymer-seed metal mixture wherein the polymer is complexed with the seed metal, (c) drying the polymer-seed metal mixture, (d) selectively irradiating the polymer-seed metal mixture in a predetermined pattern, (e) applying a chemical etch to the polymer-seed metal mixture so that the irradiated portions of the polymer-seed metal mixture etch at a slower rate than the non-irradiated portions of the polymer-seed metal mixture.

(f) removing the chemical etch and etched polymer-seed metal mixture from the substrate wherein the polymer-seed metal mixture remaining on the substrate corresponds to the predetermined pattern, and (g) placing the polymer-seed metal mixture remaining on the substrate in an electroless plating bath from the group consisting of copper, nickel and gold so that the desired conductor pattern is formed in the predetermined pattern.

21. The process in claim 20 wherein prior to step (a) the substrate surface is cleaned.

22. The process in claim 20 wherein the polymer is selected from the group consisting of poly(acrylic acid) and polyacrylamid.

23. The process in claim 20 wherein the source of irradiation is a laser beam.

24. The process in claim 20 wherein the etchant is selected from the group consisting of KOH and NaOH.

25. A process for the selective deposition of a conductor on a substrate comprising the following steps in the sequence set forth:

(a) immersing the substrate in a solution of a polymer which can complex with a seed metal, wherein the seed metal is a metal which can initiate electroless plating, (b) selectively irradiating the immersed substrate in a predetermined pattern so that the polymer is selectively deposited on the substrate where localized heating occurs corresponding to the predetermined pattern, (c) removing the non-deposited polymer solution from the substrate, (d) contacting the deposited polymer with a solution containing seed metal ions to form a deposited polymer-seed mixture wherein the deposited polymer is complexed with the seed metal, and (e) placing the deposited polymer-seed metal mixture remaining on the substrate in an electroless plating bath so that the desired conductor pattern is formed in the predetermined pattern.

26. The process in claim 25 wherein prior to step (a) the substrate surface is cleaned.

27. The process in claim 25 wherein the polymer is selected from the group consisting of poly(acrylic acid) and polyacrylamid.

28. The process in claim 25 wherein the seed metal is selected from the group consisting of palladium, platinum, gold, rhodium, and any mixture thereof.

29. The process in claim 25 wherein the source of irradiation is a laser beam.

30. The process in claim 25 wherein the electroless plating both is used to plate a metal selected from the group consisting of copper, nickel, and gold.

31. A process for the selective deposition of a conductor on a substrate comprising the following steps in the sequence set forth:

(a) immersing the substrate in a solution of a polymer which can complex with a seed metal, wherein the seed metal is a metal which can initiate electroless plating, (b) selectively irradiating the immersed substrate in a predetermined pattern so that the polymer is selectively deposited on the substrate where localized heating occurs corresponding to the predetermined pattern, (c) removing the non-deposited polymer solution from the substrate, (d) contacting the deposited polymer with a solution containing seed metal ions selected from the group consisting of palladium, platinum, gold, rhodium, and any mixture thereof to form a deposited polymer-seed metal mixture wherein the deposited polymer is complexed with the seed metal, and (e) placing the deposited polymer-seed metal mixture remaining on the substrate in an electroless plating bath from the group consisting of copper, nickel, and gold so that the desired conductor pattern is formed in the predetermined pattern.

32. The process in claim 31 wherein prior to step (a) the substrate surface is cleaned.

33. The process in claim 31 wherein the polymer is selected from the group consisting of poly(acrylic acid) and polyarcylamid.

34. The process in claim 31 wherein the source of irradiation is a laser beam.

35. The process of claims 1, 8, 13, 20, 25, or 31, wherein a metal is present on the substrate, and further comprising adding an alkaline chemical to a polymer solution to increase the PH of the polymer, thereby reducing the ability of the polymer to assist in metal etching.

36. The process of claim 35, wherein the alkaline chemical is added to the polymer prior to contacting the substrate with the polymer.

37. The process of claim 35, wherein the alkaline chemical raises the PH of the polymer solution to at least 4.

38. The process of claim 35, wherein the metal on the substrate is copper.

39. The process of claim 35, wherein the polymer is poly(acrylic acid).

40. The process of claim 35, wherein the alkaline chemical is ammonium hydroxide.

41. The process of claim 35, wherein a plurality of metals on the substrate comprise chrome on a polyimide dielectric, copper on the chrome, nickel on the copper, and gold on the nickel, and these metals adhere well to the substrate after the polymer is removed from the nonirradiated regions of the substrate.

* * * * *

UNITED STATES PATENT AND TRADEMARK OFFICE

CERTIFICATE OF CORRECTION

PATENT NO. : 5,084,299

DATED : January 28, 1992

INVENTOR(S) : Hirsch et al

It is certified that error appears in the above-indentified patent and that said Letters Patent is hereby corrected as shown below:

Column 2, line 61, insert -- ; -- after "substrate".

Column 3, line 48, change "On" to -- on --.

Column 5, line 48, change "may" to -- many --.

Column 6, line 47, insert -- Next -- before "the substrate was covered".

Column 7, line 20, insert -- 9 -- before "minutes".

Column 7, line 40, insert -- b -- after "(".

Column 7, line 57, change "claim 2" to -- claim 1 --.

Column 8, line 68, change "both" to -- bath --.

Column 9, line 39, change "." to -- , --.

Signed and Sealed this

Seventh Day of September, 1993

Attest:

BRUCE LEHMAN

*Attesting Officer*

*Commissioner of Patents and Trademarks*